United States Patent [19]

Usami et al.

[11] Patent Number: 4,815,090
[45] Date of Patent: Mar. 21, 1989

[54] DISTRIBUTED FEEDBACK SEMICONDUCTOR LASER WITH MONITOR

[75] Inventors: Masashi Usami; Shigeyuki Akiba, both of Tokyo; Katsuyuki Utaka, Musashino; Yuichi Matsushima, Tanashi, all of Japan

[73] Assignee: Kokusai Denshin Denwa Kabushiki Kaisha, Tokyo, Japan

[21] Appl. No.: 164,819

[22] Filed: Mar. 7, 1988

[30] Foreign Application Priority Data

Mar. 12, 1987 [JP] Japan ................................. 62-55286

[51] Int. Cl.4 ............................................. H01S 3/19
[52] U.S. Cl. ...................................... 372/50; 357/19; 372/29; 372/49; 372/96
[58] Field of Search ...................... 372/50, 29, 49, 96; 357/19

[56] References Cited

U.S. PATENT DOCUMENTS 4,653,058  3/1987  Akiba et al. ........................... 372/50
4,720,835  1/1988  Akiba et al. ........................... 372/50

Primary Examiner—James W. Davie
Attorney, Agent, or Firm—Emmanuel J. Lobato; Robert E. Burns

[57] ABSTRACT

A distributed feedback semiconductor laser with monitor is disclosed, in which the energy gap of a light absorbing layer provided on the window region alone is smaller than the energy gap of the light emitting layer, and in which an independent pn junction isolated from the pn junction in the laser region is provided in or at one edge of the light absorbing layer on the window region.

6 Claims, 6 Drawing Sheets

DISTRIBUTED FEEDBACK SEMICONDUCTOR LASER WITH MONITOR

BACKGROUND OF THE INVENTION

The present invention relates to a distributed feedback semiconductor laser (hereinafter referred to as a "DFB laser") having integrated therewith a photodiode equipped with a monitor function.

Since the DFB laser includes a corrugation grating of excellent wavelength selectivity, it is capable of implementing a single wavelength oscillation and is now under study for development as a light source for low-loss optical fiber communication. Generally, in case of employing a semiconductor laser, the magnitude of its optical output is monitored by a photodiode for the purpose of holding the output constant. It is customary, in this case, that the semiconductor laser and the photodiode are respectively formed by independent elements. Of semiconductor lasers, the DFB laser is not only capable of the single wavelength operation but also dispenses with a reflecting end facet which is indispensable to the conventional semiconductor laser, such as the cleavage plane; therefore, the DFB laser is suitable for monolithic integration with an element which has a function other than the laser oscillation. In particular, the afore-mentioned photodiode for monitoring the optical output can easily be integrated with the DFB laser.

However, the conventional DFB laser with monitor has a defect in that pn junctions of its laser region and its monitor region cannot be electrically separated by diffusion of zinc alone.

SUMMARY OF THE INVENTION

An object of the present invention is to provide a distributed feedback semiconductor laser with monitor which obviates the above-mentioned defects of the prior art and which permits easy electrical isolation of the pn junctions in the laser and monitor regions and ensures a stable sensitivity regardless of temperature variations.

The feature of the present invention resides in that to further improve the electrical isolation in the DFB laser with a monitor proposed in the afore-mentioned application (Japanese Pat. Disclosure No. 150895/87) filed by the same applicant as the subject application, the energy gap of a light absorbing layer provided on the window region alone is smaller than the energy gap of the light emitting layer and in that an independent pn junction isolated from the pn junction in the laser region is provided in or at one edge of the light absorbing layer on the window region.

BRIEF DESCRIPTION OF THE DRAWINGS

The present invention will be described in detail below with reference to the accompanying drawings, in which.

DETAILED DESCRIPTION

To make differences between prior art and the present invention clear, an example of prior art will first be described.

Figure 1:
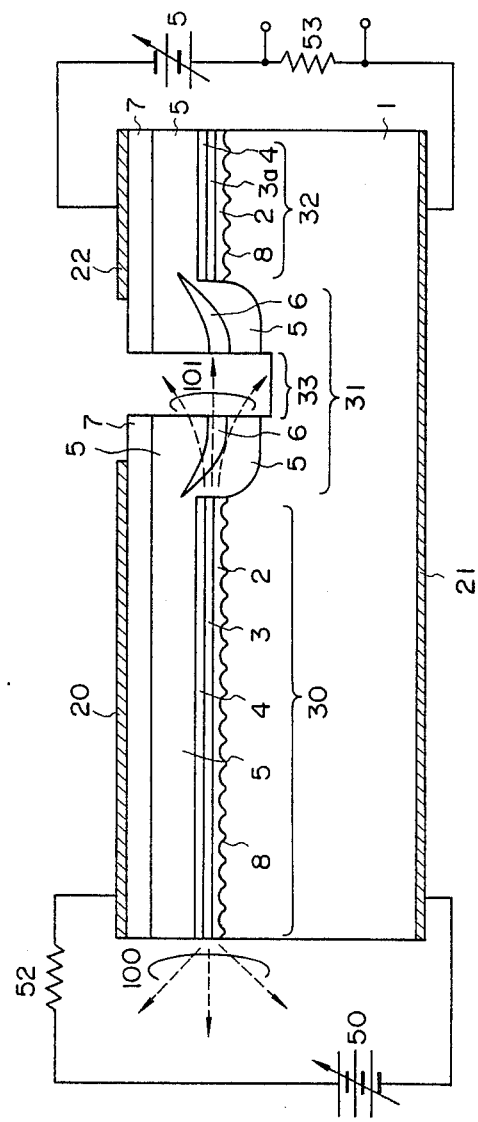
FIG. 1 is a longitudinal-sectional view showing an example of a conventional DFB laser with a monitor.

FIG. 1 is a schematic diagram of a conventional DFB laser with a monitor (Japanese Pat. Pub. Disc. No. 186986/83). In this prior art example, an n-type InGaAsP waveguide layer 2, an InGaAsP light emitting layer 3, a p-type InGaAsP buffer layer 4 and a p-type InP layer 5 are formed on an n-type InP substrate 1. A corrugation grating formed by periodically varying the film thickness of the n-type InGaAsP waveguide layer 2 provides effective periodic refractive index variations along the direction of travel of light, forming a laser region 30. At one end of the light emitting layer 3 there are buried the p-type InP layer 5 and an n-type InP layer 6 each of which is a semiconductor layer of a larger energy gap than that of the light emitting layer 3, thus forming a window region 31. At the other end of the window region 31 there is formed a monitor region 32 of the same layer structure as the laser region 30. The three regions 30, 31 and 32 thus formed are all covered with a p-type InGaAsP cap layer 7 for forming thereon electrodes. A groove 33 is provided for electrically isolating the laser region 30 and the monitor region 32 from each other, but a high resistance semiconductor layer may also be provided in place of the groove 33. Reference numerals 20, 21 and 22 indicate electrodes, 50 and 52 the power supply and a resistor for the laser region 30, and 51 and 53 the power supply and a resistor for the monitor region 32, respectively. Reference numeral 100 designates the optical output emitted from the laser region 30 and 101 the optical output emitted into the window region 31. A portion of the optical output 101 is absorbed by a detecting layer 3a included in the monitor region 32 and having the same composition as that of the light emitting layer 3, and the resulting electromotive force will appear as a monitor signal.

Such a DFB laser with a monitor is easy of fabrication, and experimental results show a high monitor sensitivity of about 0.2 mA/mW. Since the light detecting layer 3a in the monitor region 32 has the same composition as that of the light emitting layer 3 in the laser region 30, however, this DFB laser has a defect that the monitor sensitivity undergoes substantial variations with temperature. That is, since the photon energy of the laser output light 100 or 101 is substantially equal to the energy gaps of the light emitting layer 3 and the detecting layer 3a, the absorption coefficient of the monitor region 32 varies markedly, depending on the relationship between the wavelength of the output light and the energy gap of the detecting layer 3a in the monitor region 32. Since the wavelength of the laser output light is based on the DFB oscillation, its temperature coefficient is as small as approximately 1 Å/K, whereas the temperature coefficient of the energy gap of the detecting layer 3a is about five times larger than the temperature coefficient of the laser region 30. For instance, if temperature rises (or falls) by one degree in terms of absolute temperature, then the oscillation wavelength of the laser region 30 will become longer (or shorter) by 1 Å or so. On the other hand, the energy gap of the detecting layer 3 in the monitor region 32 shifts toward the longer wavelength (or the shorter wavelength) by as much as around 5 Å in terms of wavelength, causing a great increase in its light absorption coefficient.

Figure 2:
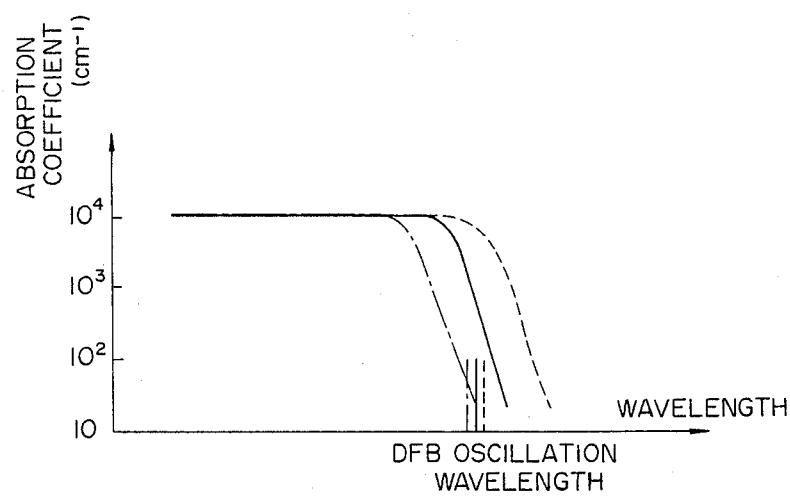
FIG. 2 is a graph showing the relationship between the oscillation wavelength of the conventional DFB laser and the absorption coefficient of its detecting layer.

FIG. 2 shows the relationship between the oscillation wavelength of the conventional DFB laser with a monitor and the absorption coefficient of its detecting layer 3a to temperature change. In FIG. 2 the solid lines indicate the oscillation wavelength of the DFB laser (substantially equal to the energy gap of the light emitting layer 3) dependent on the period of the corrugation grating 8 of the laser region 30 at room temperature $t_0$ and the absorption coefficient of the monitor region 32 dependent on the energy gap of the detecting layer 3a. The broken lines and the one-dot chain lines indicate states in temperature elevated and lowered conditions, respectively. As temperature rises, the energy gap of the detecting layer 3a becomes smaller and consequently its absorption coefficient extends to the longer wavelength, but when temperature drops, the reverse of the above will result. Therefore, when temperature changes, the rate at which the oscillation output light of the DFB laser is absorbed by the detecting layer 3a becomes inconstant and the monitor sensitivity also varies. Accordingly, in a state in which the absorption coefficient greatly changes with temperature, the detection of the output power by the monitor is so inaccurate that the use of the DFB laser is difficult for practical applications.

Figure 3:
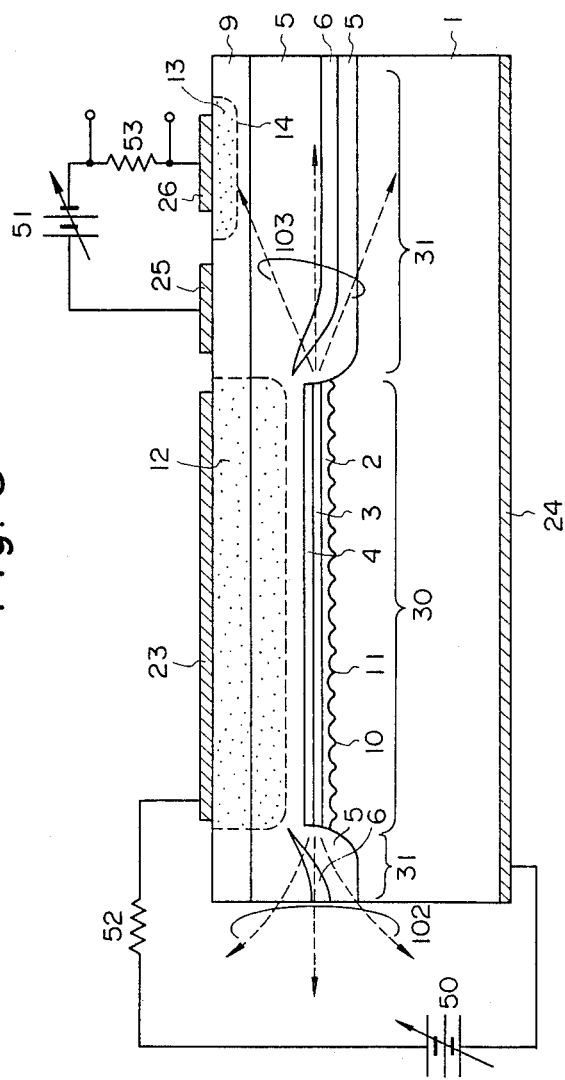
FIG. 3 is a schematic cross-sectional view showing another conventional DFB laser with a monitor.

The same applicant as the subject application has already filed a patent application (Japanese Pat. Disclosure No. 150895/87 corresponding to Japanese Pat. Appln. No. 290846/85 filed on Dec. 25, 1985) on a DFB laser with a monitor intended as a solution to the above problem. FIG. 3 is its sectional view.

In FIG. 3, reference numeral 9 indicates an InGaAsP or InGaAs cap layer whose energy gap is smaller than that of the InGaAsP light emitting layer 3, 10 a corrugation grating which has a phase shift 11 of a quarter wavelength, 12 and 13 zinc diffused regions which change an n-type semiconductor layer to a p-type one and electrically isolate the laser region 30 and the window region 31 from each other, 23 and 24 electrodes for the laser, 25 and 26 electrodes for the monitor, 102 the laser output light which is the main output, and 103 the output light for monitoring.

With this structure, the cap layer (a light absorbing layer) 9 which has a smaller energy gap than that of the light emitting layer 3 is provided in each of the laser region 30 and the window region 31 and a pn junction 14 isolated from a pn junction in the laser region 31 is provided in the cap layer 9 on the window region 31, by which the absorption coefficient of the cap layer (the light absorbing layer) 9 is always held constant in the vicinity of the oscillation wavelength of the DFB laser, permitting a high monitor efficiency and stable monitoring even in a temperature changing condition.

However, the manufacture of such a structure as shown in FIG. 3, even by the existing manufacturing techniques, encounters difficulty in electrically isolating the pn junctions in the laser region 30 and the monitor region 31 through the diffusion of zinc alone, resulting in no desired monitor efficiency being obtained.

With reference to the accompanying drawings, the present invention will hereinafter be described in detail.

In the following description the parts corresponding to those in FIG. 3 are identified by the same reference numerals and no description will be repeated thereof.

(Embodiment 1)

Figure 4:
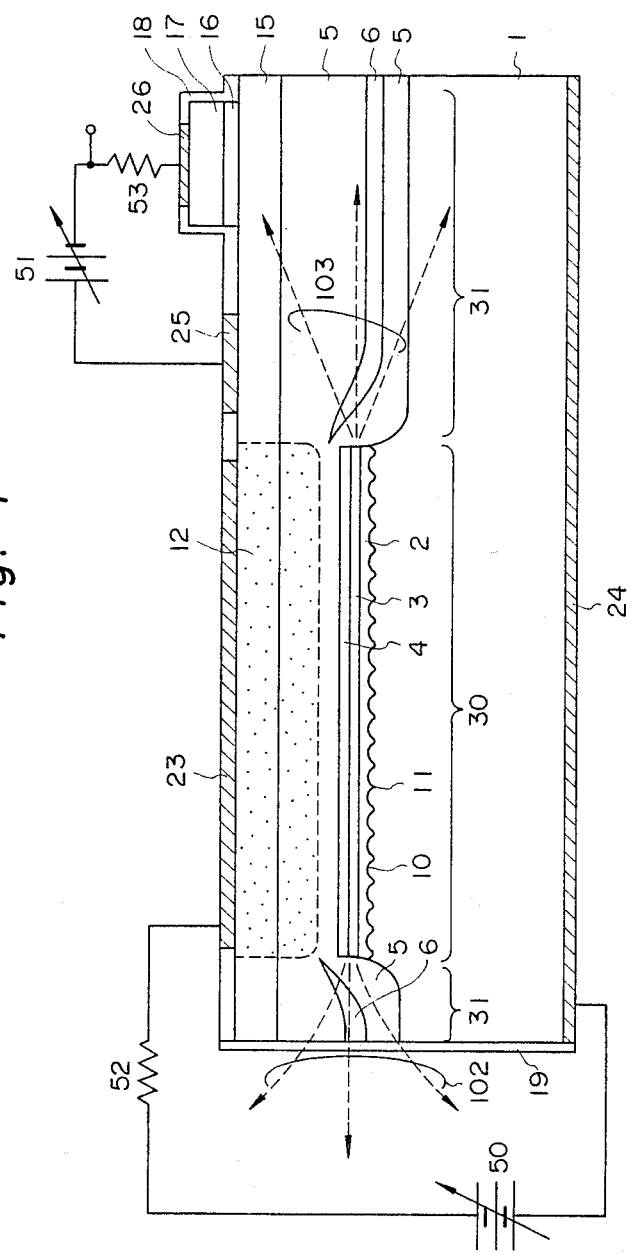
FIG. 4 is a schematic longitudinal-sectional view of the DFB laser with a monitor according to the present invention.

FIG. 4 schematically illustrates, in section, a first embodiment of the DFB laser with a monitor according to the present invention.

This embodiment differs from the prior art example shown in FIG. 3 in that a p-type InGaAsP layer 15 of a larger energy gap than that of the light emitting layer 3 is provided in place of the cap layer (the light absorbing layer) 9 of a smaller energy gap than that of the light emitting layer 3 and in that a p-type InGaAs layer 16 and an n-type InGaAs layer 17 of different conductivity types, which have a smaller energy gap than that of the light emitting layer 3 and constitute light absorbing layers, are provided on a limited area of the p-type InGaAsP layer 15 of the window region 31. In this embodiment an insulating film 18 such as an SiO$_2$ or SiN film is coated over the laser region 30 and the window region 31 between the electrodes 23 and 25 and the electrode 26, for protecting the surface of the device. Reference numeral 19 indicates an antireflection coating film such as an SiN film, which is provided for effectively leading out the main output 102.

Conventionally, as shown in FIG. 3, the cap layer 9 which acts as a light absorbing layer is provided over the laser region 30 and the window region 31, and a pn junction isolated from the pn junction in the laser region 30 is formed in the cap layer 9 on the window region 30. In case of forming such an isolated pn junction in the cap layer 3, zinc is diffused as shown in FIG. 3. However, it is difficult, with the present zinc diffusion technique, to control the diffusion depth and the diffusion concentration with excellent reproducibility; accordingly, the formation of an excellent isolated pn junction is difficult.

In contrast thereto, according to the present invention, the p-type InGaAs layer 16 and the n-type InGaAs layer 17 which constitute the monitor are formed, separated from the pn junction of the laser region 30, in only the window region 31 on the p-type InGaAsP layer 15 whose energy gap is larger than that of the light emitting layer 3. Furthermore, the surface of the device is protected with the insulating film 18 so that the electrodes 23, 25 and 26 are not affected by one another, thereby providing stable electrical isolation of them. Moreover, the light absorbing layer 16 is formed thin for enhancing the light absorption efficiency at the pn junction formed between the light absorbing layers 16 and 17.

The DFB laser with a monitor depicted in FIG. 4 can be manufactured by epitaxial growth of the layers from 2 to 15 in succession on the substrate 1, similarly epitaxial growing the light absorbing layers 16 and 17 of the present invention all over the surfaces of the laser region 30 and the window regions 31, and then etching away the light absorbing layers 16 and 17 on the laser region 30 and a selected portion of each of the light absorbing layers 16 and 17 on the window region 31.

Figure 5:
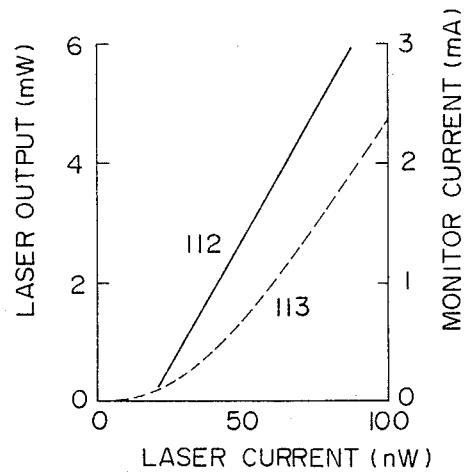
FIG. 5 is a graph showing experimental results of the laser output-laser current characteristic and the monitor current-laser current characteristic measured using the DFB laser with a monitor according to the present invention.

FIG. 5 shows the experimental results measured on the DFB laser with a monitor of the present invention produced by the above-said manufacturing method. Shown in FIG. 5 are a laser output (the main output 102)-laser current characteristic 112 and a monitor current (optical current flowing across the resistor 53)-laser current characteristic 113 obtained in a case where the resistance value of the resistor 53 was 10 ohms, a bias voltage of the power supply was 0 volt and temperature was 25° C. The oscillation wavelength in the laser region 30 is 1.54 μm.

In the DFB laser the proportional relationship between the front output (the main output 102 in FIG. 4) and the rear output (the monitor output 103) is not fixed in general. In the above-mentioned experiment, the rear output is somewhat super linear with respect to the laser current. Moreover, in FIG. 4 the quarter wavelength phase shift 11 is a little shifted further to the left (toward the main output 102) from the center of the laser region 30 so that the front output may be greater than the rear output.

Figure 6:
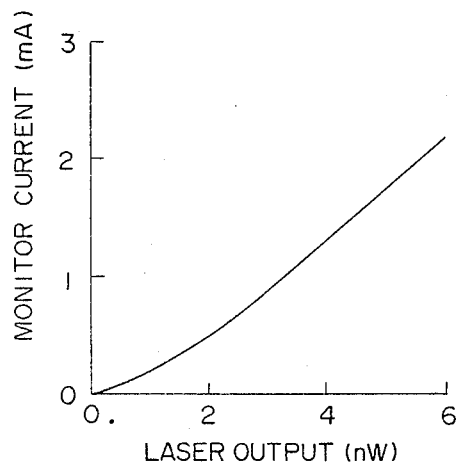
FIG. 6 is a graph showing the monitor current-laser output characteristic of the DFB laser with a monitor according to the present invention.

FIG. 6 shows experimental results on the DFB laser with a monitor according to the present invention. Shown in FIG. 6 is the relationship between the laser output (the main output 102) and the monitor current (the monitor output 103) measured at different temperatures (13° C., 25° C. and 40° C.). As is evident from FIG. 6, the relationship is kept constant regardless of temperature changes, by selecting the energy gaps of the light absorbing layers 16 and 17 to be smaller than the energy gap of the light emitting layer 3. Accordingly, by controlling the laser current so that the monitor current remains constant, a fixed laser output 102 can be obtained regardless of a temperature change.

(Embodiment 2)

Figure 7:
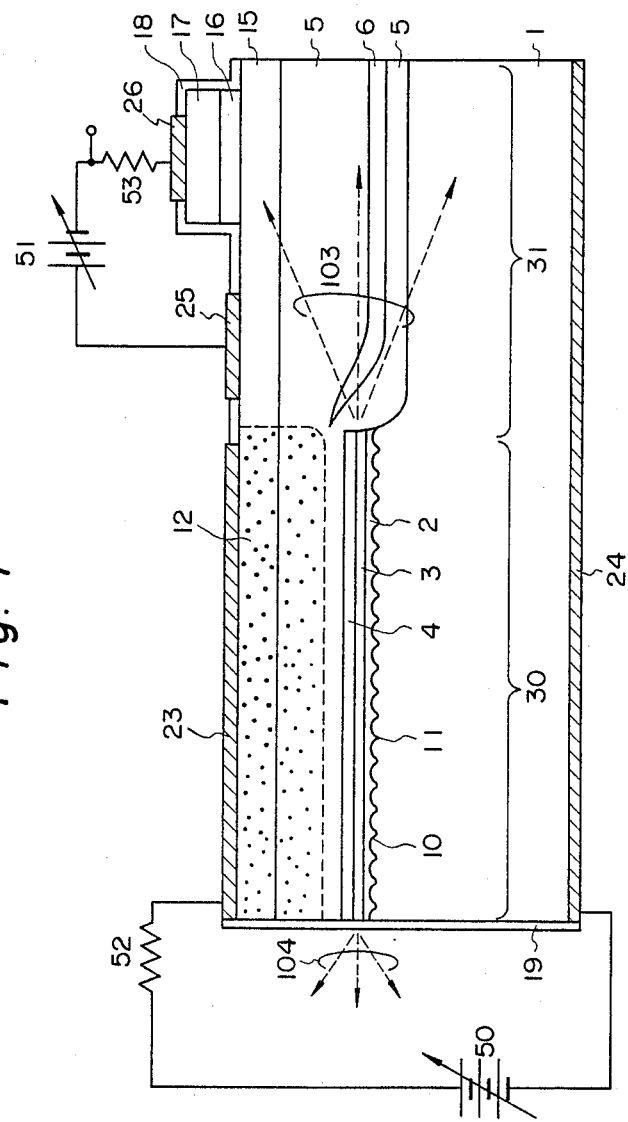
FIG. 7 is a schematic longitudinal-sectional view illustrating a second embodiment of the DFB laser with a monitor according to the present invention.

FIG. 7 illustrates a second embodiment of the present invention. This embodiment differs from the first embodiment in that the window region 31 is provided only at the right-hand end of the light emitting layer 3 and the anti-reflection coating film 19 is formed on the left-hand end face of the light emitting layer 3 from which the main output 104 is emitted. Incidentally, the DFB laser having the quarter wavelength phase shift 11 exhibits the highest single wavelength selectivity when the both ends of the light emitting layer 3 are nonreflective. The nonreflection is implemented by the window region 31 or the antireflection coating film 19. The operation of this embodiment is the same as in the case of FIG. 4.

While the above description has made no reference to a stripe structure for the lateral mode stabilization, the present invention is also applicable to a buried stripe structure, a plano-concex waveguide structure, and various other stripe structures. Besides the semiconductor materials are not limited specifically to those of the InGaAsP/InP system but may also be other materials of the AlInGaAs/InP system, the AlGaAs/GaAs system, and so forth.

Moreover, the light absorbing layers 16 and 17 have been described to be InGaAs layers, but they may be formed by semiconductor layers whose energy gap is smaller than that of the light emitting layer 3, such as InGaAsP layers.

Although in the above embodiments the monitoring pn junction is formed in the InGaAs light absorbing layers 16 and 17 of the window region 31, the monitoring pn junction may also be formed by the p-type InGaAsP layer 15 and the n-type InGaAs light absorbing layer 17 while eliminating the layer 16, so that the monitoring pn junction is produced along the lower edge of the light absorbing layer 17.

As described above, according to the present invention, a semiconductor layer which has an energy gap smaller than that of the light emitting layer 3 is used as the light absorbing layer 16 (17), and the pn junction on the window region 31 is electrically isolated from the pn junction in the laser region 30. This structure provides a DFB laser with a monitor which is high in monitor efficiency and capable of stable monitoring even in a temperature changing condition.

In addition, according to the present invention, since the isolation between the laser region 30 and the monitor need not be effected by etching or like means and since the monitor region is formed in a limited portion of the window region 31, it is possible to obtain a DFB laser with a monitor which is small and easy to manufacture. Accordingly, the present invention not only dispenses with the photo-diode which is disposed independently of the DFB laser in the prior art but also precludes the possibility of malfunction which would otherwise be caused by an error in their relative positioning, and hence the invention offers a low-cost highly reliable laser output monitor. Such a DFB laser with a monitor can be widely utilized in the fields of optical fiber communication and optical measurement, and hence is of great utility in practical applications.

What we claim is:

1. A distributed feedback semiconductor laser with monitor, comprising: a laser region having a light emitting layer, an effective periodic refractive index variation along the direction of travel of light and a pn junction provided in the vicinity of the light emitting layer; a window region formed by burying in at least one end of the light emitting layer a semiconductor layer of a larger energy gap than that of the light emitting layer; and a light absorbing layer formed on the window region; wherein the energy gap of the light absorbing layer is set to a value smaller than the energy gap of the light emitting layer, and a pn junction isolated from the pn junction in the laser region is provided in the light absorbing layer on the window region so that a part of a light output from the light emitting layer is monitored through the pn junction in the window region.

2. A distributed feedback semiconductor laser with monitor according to claim 1, further comprising an antireflection coating film provided at one end of the laser region to pass therethrough the main part of the light output from the light emitting layer.

3. A distributed feedback semiconductor laser with monitor according to claim 1, in which the light absorbing layer is formed on a p-type layer having a value of energy gap larger than that of the light emitting layer.

4. A distributed feedback semiconductor laser with monitor, comprising: a laser region having a light emitting layer, an effective periodic refractive index variation along the direction of travel of light and a pn junction provided in the vicinity of the light emitting layer; a window region formed by burying in at least one end of the light emitting layer a semiconductor layer of a larger energy gap than that of the light emitting layer; and a light absorbing layer formed on the window region; wherein the energy gap of the light absorbing layer is set to a value smaller than the energy gap of the light emitting layer, and a pn junction isolated from the pn junction in the laser region is provided at one edge of the light absorbing layer on the window region so that a part of a light output from the light emitting layer is monitored through the pn junction in the window region.

5. A distributed feedback semiconductor laser with monitor according to claim 4, further comprising an antireflection coating film provided at one end of the laser region to pass therethrough the main part of the light output from the light emitting layer.

6. A distributed feedback semiconductor laser with monitor according to claim 4, in which the light absorbing layer is formed on a p-type layer having a value of energy gap larger than that of the light emitting layer.

* * * * *